US012062589B2

(12) United States Patent
Lis et al.

(10) Patent No.: US 12,062,589 B2
(45) Date of Patent: Aug. 13, 2024

(54) SEMICONDUCTOR PACKAGES INCLUDING RECESSES TO CONTAIN SOLDER

(71) Applicant: Infineon Technologies AG, Neubiberg (DE)

(72) Inventors: Adrian Lis, Regensburg (DE); Michael Ledutke, Saal (DE)

(73) Assignee: Infineon Technologies AG, Neubiberg (DE)

( * ) Notice: Subject to any disclaimer, the term of this patent is extended or adjusted under 35 U.S.C. 154(b) by 452 days.

(21) Appl. No.: 17/361,823

(22) Filed: Jun. 29, 2021

(65) Prior Publication Data
US 2022/0415745 A1 Dec. 29, 2022

(51) Int. Cl.
| | |
|---|---|
| *H05K 1/11* | (2006.01) |
| *H01L 21/48* | (2006.01) |
| *H01L 23/367* | (2006.01) |
| *H01L 23/373* | (2006.01) |
| *H01L 23/42* | (2006.01) |
| *H05K 7/14* | (2006.01) |

(52) U.S. Cl.
CPC ...... *H01L 23/3675* (2013.01); *H01L 21/4871* (2013.01); *H01L 23/3735* (2013.01); *H01L 23/42* (2013.01)

(58) Field of Classification Search
CPC . H01L 23/3675; H01L 23/3735; H01L 23/42; H01L 21/4871; H05K 3/107; H05K 7/142; H05K 7/1418; H05K 2201/10568; H05K 2201/10583; H05K 2201/2036; H05K 2203/0455
See application file for complete search history.

(56) References Cited

U.S. PATENT DOCUMENTS

| | | | |
|---|---|---|---|
| 2007/0145540 A1* | 6/2007 | Mochida | H01L 24/33 257/659 |
| 2017/0278774 A1* | 9/2017 | Hayashi | H01L 23/49562 |
| 2018/0277462 A1* | 9/2018 | Takahagi | H01L 23/3114 |
| 2020/0365498 A1* | 11/2020 | Kawashima | H01L 23/49575 |

\* cited by examiner

*Primary Examiner* — Hoa C Nguyen
(74) *Attorney, Agent, or Firm* — Dicke, Billig & Czaja, PLLC

(57) ABSTRACT

One example of a semiconductor package includes a first substrate, a second substrate, a semiconductor die, and a spacer. The semiconductor die is attached to the first substrate. The spacer is attached to the semiconductor die and attached to the second substrate via solder. A surface of the second substrate facing the spacer includes a plurality of recesses extending from proximate at least one edge of the spacer to contain a portion of the solder.

20 Claims, 11 Drawing Sheets

SEMICONDUCTOR PACKAGES INCLUDING RECESSES TO CONTAIN SOLDER

BACKGROUND

Semiconductor packages, such as double sided cooling (DSC) modules, may include components (e.g., semiconductor dies, spacers, bond wires, bond pads, etc.) between two substrates. During the fabrication of such packages, it is necessary to connect components such as semiconductor chips and spacers to both of the two substrates, so soldering may need to take place on the underside of the upper substrate. There is a need therefore to carry out such soldering operations reliably.

For these and other reasons, a need exists for the present disclosure.

SUMMARY

One example of a semiconductor package includes a first substrate, a second substrate, a semiconductor die, and a spacer. The semiconductor die is attached to the first substrate. The spacer is attached to the semiconductor die and attached to the second substrate via solder. A surface of the second substrate facing the spacer includes a plurality of recesses extending from proximate at least one edge of the spacer to contain a portion of the solder.

Another example of a semiconductor package includes a first direct bonded copper (DBC) substrate, a second DBC substrate, a semiconductor die, and a spacer. The semiconductor die is attached to the first DBC substrate. The spacer is attached to the semiconductor die and attached to the second DBC substrate via solder. A copper layer of the second DBC substrate facing the spacer includes a plurality of recesses extending from proximate at least one edge of the spacer to contain a portion of the solder.

One example of a method for fabricating a semiconductor package includes attaching a semiconductor die to a first substrate. The method further includes attaching a spacer to the semiconductor die. The method further includes soldering a second substrate to the spacer such that at least one recess in a surface of the second substrate facing the spacer extends from proximate a first edge of the spacer.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Semiconductor packages, such as double sided cooling (DSC) modules, may include components (e.g., semiconductor dies, spacers, bond wires, bond pads, etc.) between two substrates. During fabrication of such semiconductor packages, liquid solder may drop down and/or splash during soldering when the substrates are soldered to the components and/or the components are soldered to the substrates. If the liquid solder drops or splashes onto bond pads or bond wires, there is a risk for electrical shorts.

Figure 1A:
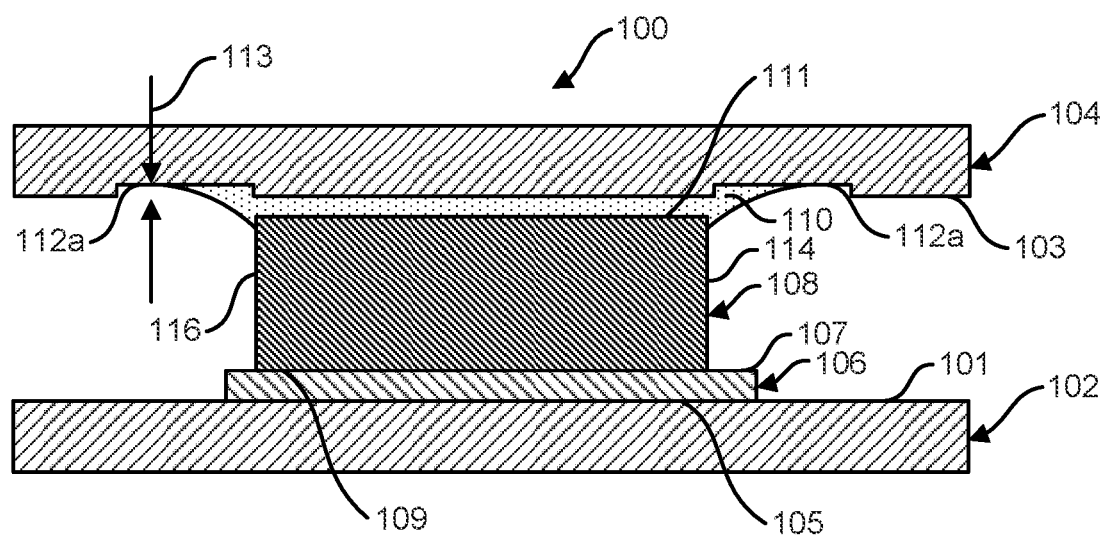
FIG. 1A is a cross-sectional view illustrating one example of a semiconductor package including recesses to contain solder.

FIG. 1A is a cross-sectional view illustrating one example of a semiconductor package 100. Semiconductor package 100 includes a first substrate 102, a second substrate 104, a semiconductor die 106, and a spacer 108. One surface 105 (e.g., the bottom surface) of the semiconductor die 106 is attached to a surface 101 (e.g., top surface) of the first substrate 102 (e.g., via an adhesive material or solder). One surface 109 (e.g., the bottom surface) of the spacer 108 is attached to another surface 107 (e.g., the top surface) of the semiconductor die 106. Another surface 111 (e.g., the top surface) of the spacer 108 is attached to one surface 103 (e.g., the bottom surface) of the second substrate 104 via solder 110. The surface 103 (e.g., bottom surface) of the second substrate 104 facing the spacer 108 includes a plurality of recesses 112a extending from proximate at least one edge 114 and/or 116 of the spacer 108 to contain a portion of the solder 110. The plurality of recesses 112a as illustrated contain the portion of the solder 110. In other examples, the surface 101 (e.g., top surface) of the first substrate 102 may also include a plurality of recesses (not shown) extending from proximate at least one edge of the semiconductor die 106 to contain a portion of solder between the semiconductor die 106 and the first substrate 102.

By including recesses 112a in the second substrate 104 and/or in the first substrate 102, liquid solder is prevented from dropping down or splashing during soldering as any excess solder may be contained by the recesses. In addition, recesses 112a may provide increased adhesion between the second substrate 104 and the spacer 108. The recesses 112a may also guide any excess solder outside of areas of the semiconductor package 100 where electrical shorts are a risk.

Figure 1B:
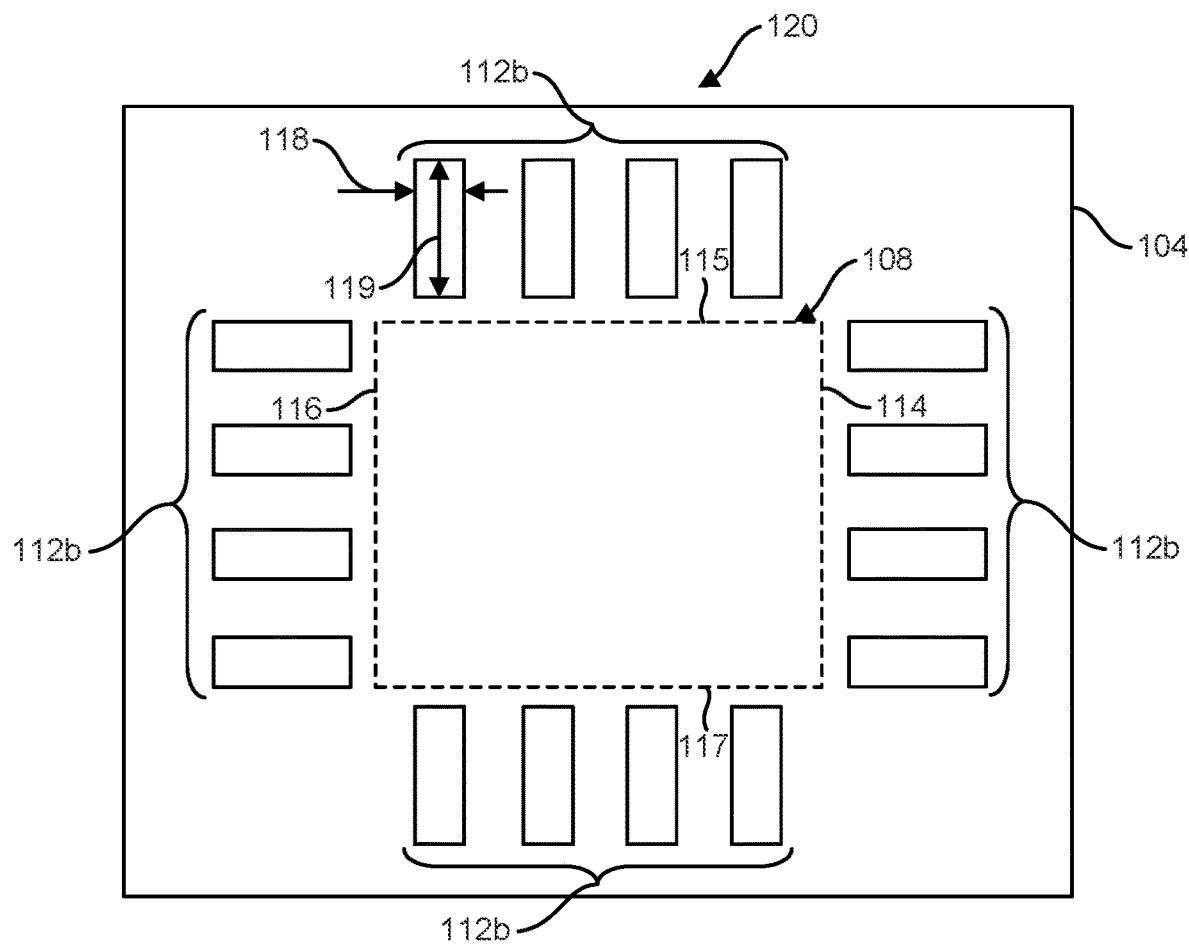
FIGS. 1B-1F are top views illustrating example substrates including recesses to contain solder for use in semiconductor packages.

First substrate 102 and second substrate 104 may be copper substrates, aluminum substrates or other suitable substrates. Spacer 108 may be a copper spacer, an aluminum spacer, or another suitable metal spacer. Recesses 112a partially extend into the second substrate 104, such as up to one half the thickness of the second substrate 104. Each recess includes a depth 113 (as shown in FIG. 1A), a width 118 (as shown in FIG. 1B), and a length 119 (as shown in FIG. 1B), wherein the length is greater than the depth and the width. The width of each recess may be on the order of micrometers to millimeters wide. The length of each recess may be on the order of micrometers to millimeters long.

FIG. 1B is a top view illustrating an example configuration 120 of the second substrate 104 of FIG. 1A. Spacer 108 of FIG. 1A is indicated by dashed lines in FIG. 1B. In this example, a plurality of recesses 112b extend from proximate each of the four edges 114, 115, 116, and 117 of the spacer 108 and extend perpendicular to each edge 114, 115, 116, and 117 of the spacer 108. In this example, recesses 112b do not extend between the spacer 108 and the second substrate 104. While four recesses 112b are illustrated proximate each edge 114, 115, 116, and 117 of the spacer 108 in FIG. 1B, in other examples, less than four recesses or more than four recesses may be arranged proximate each edge 114, 115, 116, and 117 of the spacer 108. In addition, while recesses 112b are illustrated proximate four edges 114, 115, 116, and 117 of the spacer 108 in FIG. 1B, in other examples, recesses 112b may be arranged proximate only one edge, two edges, or three edges of the spacer 108. Further, while recesses 112b are illustrated as rectangular in shape, in other examples, recesses 112b may have other suitable shapes, such as arc shaped, square shaped, triangular shaped, etc. In other examples, the second substrate 104 may be replaced by the first substrate 102, and the spacer 108 may be replaced by the semiconductor die 106 in FIG. 1B (and in the following FIGS. 1C-1F), such that recesses 112b extend from proximate at least one edge of the semiconductor die 106 to contain a portion of the solder used to solder the semiconductor die 106 to the first substrate 102.

Figure 1C:
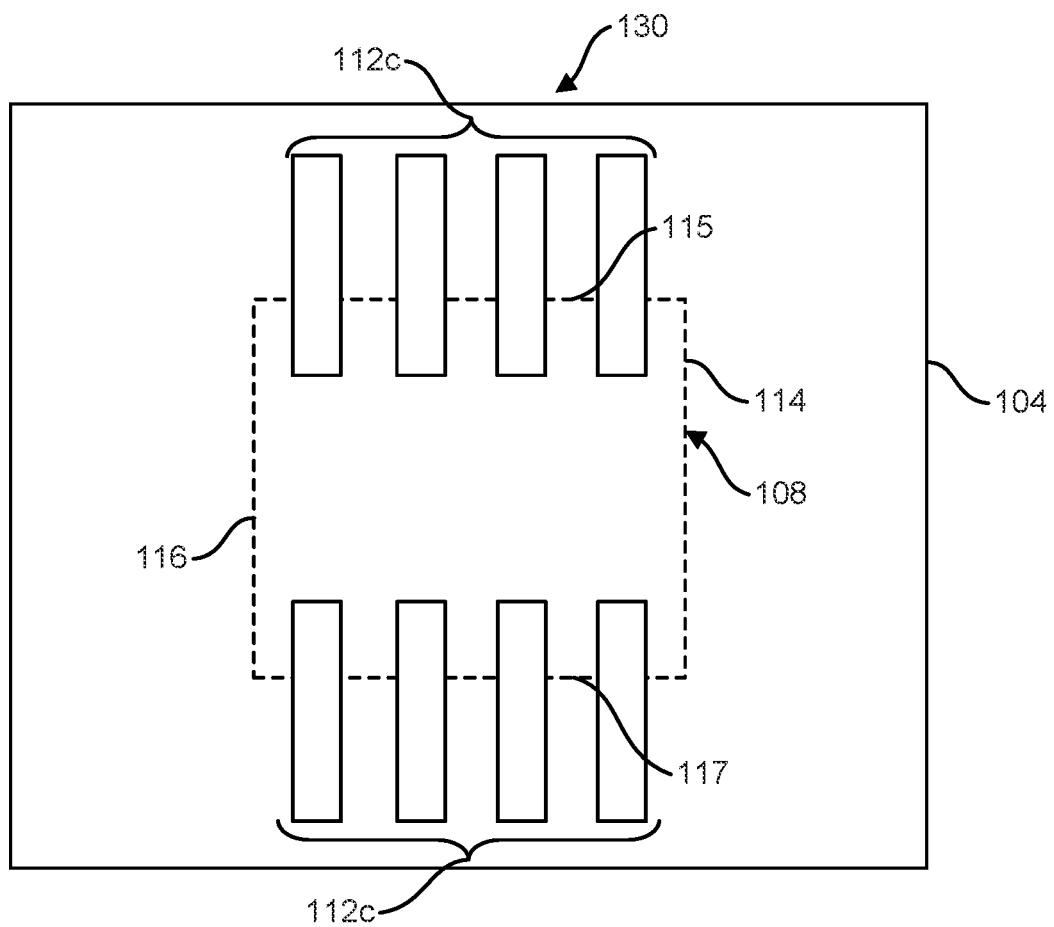

FIG. 1C is a top view illustrating an example configuration 130 of the second substrate 104 of FIG. 1A. Spacer 108 of FIG. 1A is indicated by dashed lines in FIG. 1C. In this example, recesses 112c include a first plurality of recesses 112c extending from proximate the edge 115 of the spacer 108 and a second plurality of recesses 112c extending from proximate the edge 117 of the spacer 108. Recesses 112c extend perpendicular to each edge 115 and 117 of the spacer 108. In this example, recesses 112c extend at least partially between the spacer 108 and the second substrate 104. While four recesses 112c are illustrated proximate each edge 115 and 117 of the spacer 108 in FIG. 1C, in other examples, less than four recesses or more than four recesses may be arranged proximate each edge 115 and 117 of the spacer 108. In addition, while recesses 112c are illustrated proximate two edges 115 and 117 of the spacer 108 in FIG. 1B, in other examples, recesses 112c may be arranged proximate one edge, three edges, or four edges of the spacer 108.

Figure 1D:
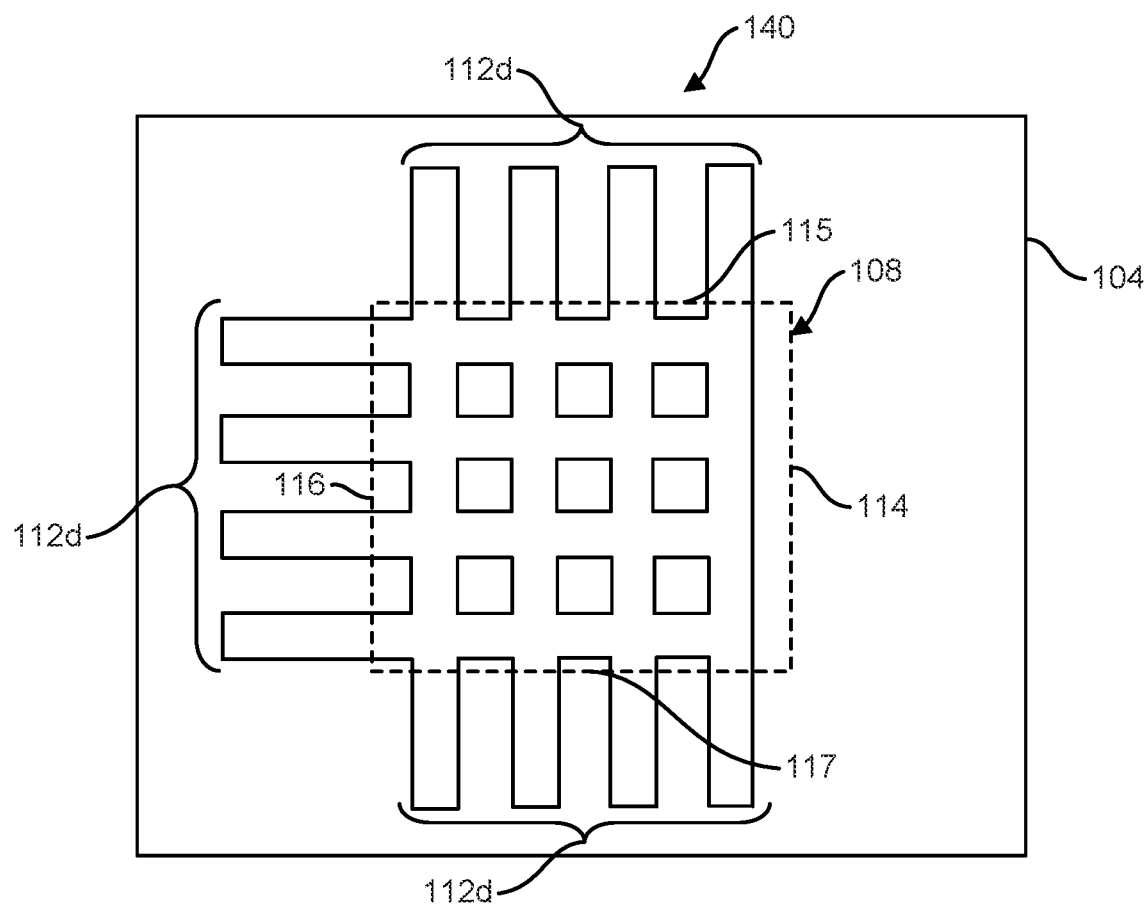

FIG. 1D is a top view illustrating an example configuration 140 of the second substrate 104 of FIG. 1A. Spacer 108 of FIG. 1A is indicated by dashed lines in FIG. 1D. In this example, recesses 112d include a first plurality of recesses 112d extending from proximate the edge 115 of the spacer 108, a second plurality of recesses 112d extending from proximate the edge 116 of the spacer 108, and a third plurality of recesses 112d extending from proximate the edge 117 of the spacer 108. In this example, recesses 112d extend between the spacer 108 and the second substrate 104 and intersect such that a grid pattern is formed between the spacer 108 and the second substrate 104. While four recesses 112d are illustrated proximate each edge 115, 116, and 117 of the spacer 108 in FIG. 1D, in other examples, less than four recesses or more than four recesses may be arranged proximate each edge 115, 116, and 117 of the spacer 108. In addition, while recesses 112d are illustrated proximate three edges 115, 116, and 117 of the spacer 108 in FIG. 1D, in other examples, recesses 112d may be arranged proximate one edge, two edges, or four edges of the spacer 108.

Figure 1E:
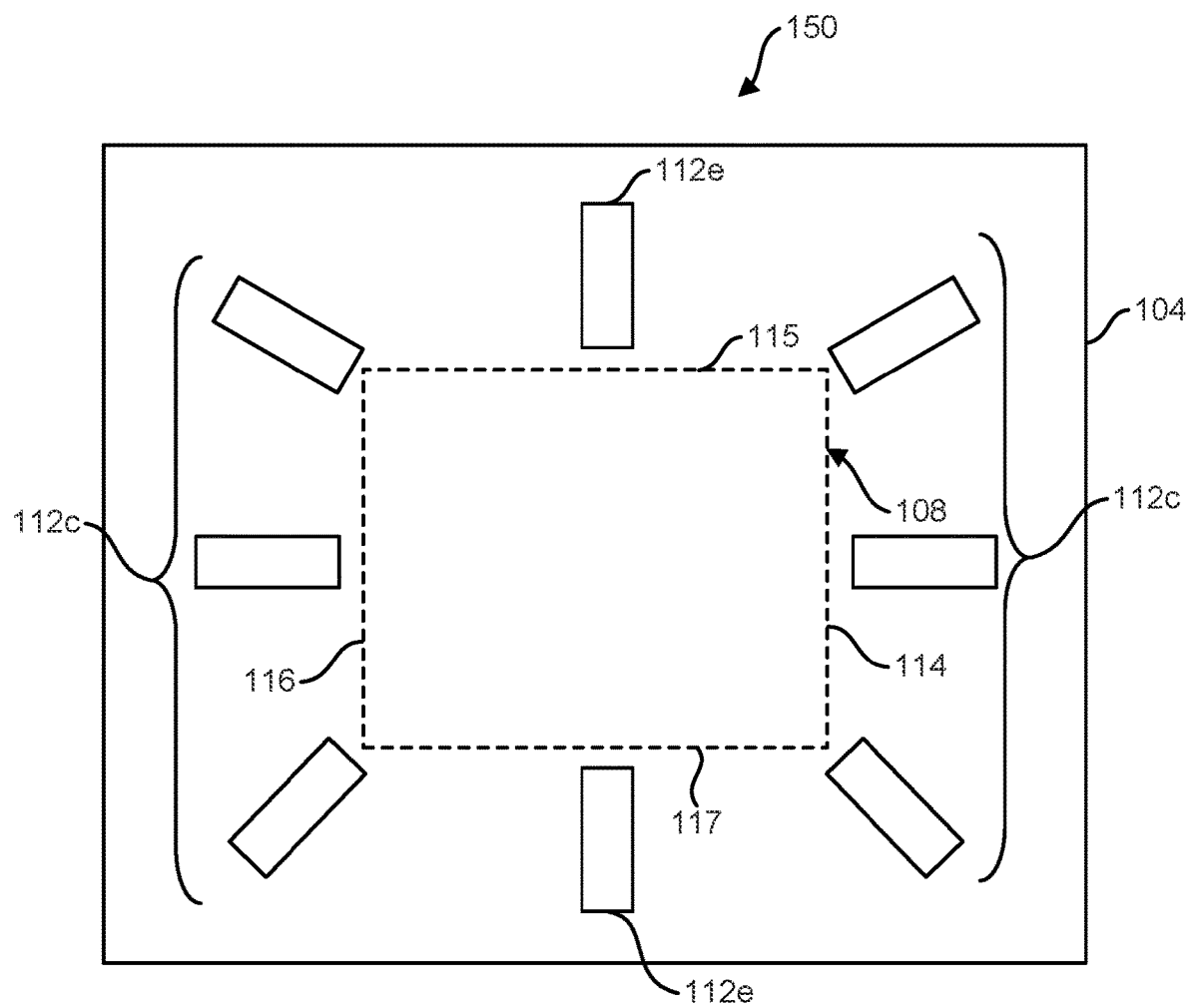

FIG. 1E is a top view illustrating an example configuration 150 of the second substrate 104 of FIG. 1A. Spacer 108 of FIG. 1A is indicated by dashed lines in FIG. 1E. In this example, a plurality of recesses 112e extend radially from the spacer 108, such that a recess 112e extends from proximate each of the four edges 114, 115, 116, and 117 of the spacer 108 and a recess 112e extends from proximate each corner of the spacer 108. In this example, recesses 112e do not extend between the spacer 108 and the second substrate 104. While eight recesses 112e extending radially from the spacer 108 are illustrated in FIG. 1B, in other examples, less than eight recesses or more than eight recesses may extend radially from the spacer 108. In addition, while recesses 112e are illustrated proximate four edges 114, 115, 116, and 117 and four corners of the spacer 108 in FIG. 1E, in other examples, recesses 112e may be arranged proximate only one edge, two edges, or three edges of the spacer 108 and/or proximate only one corner, two corners, or three corners of the spacer 108.

Figure 1F:
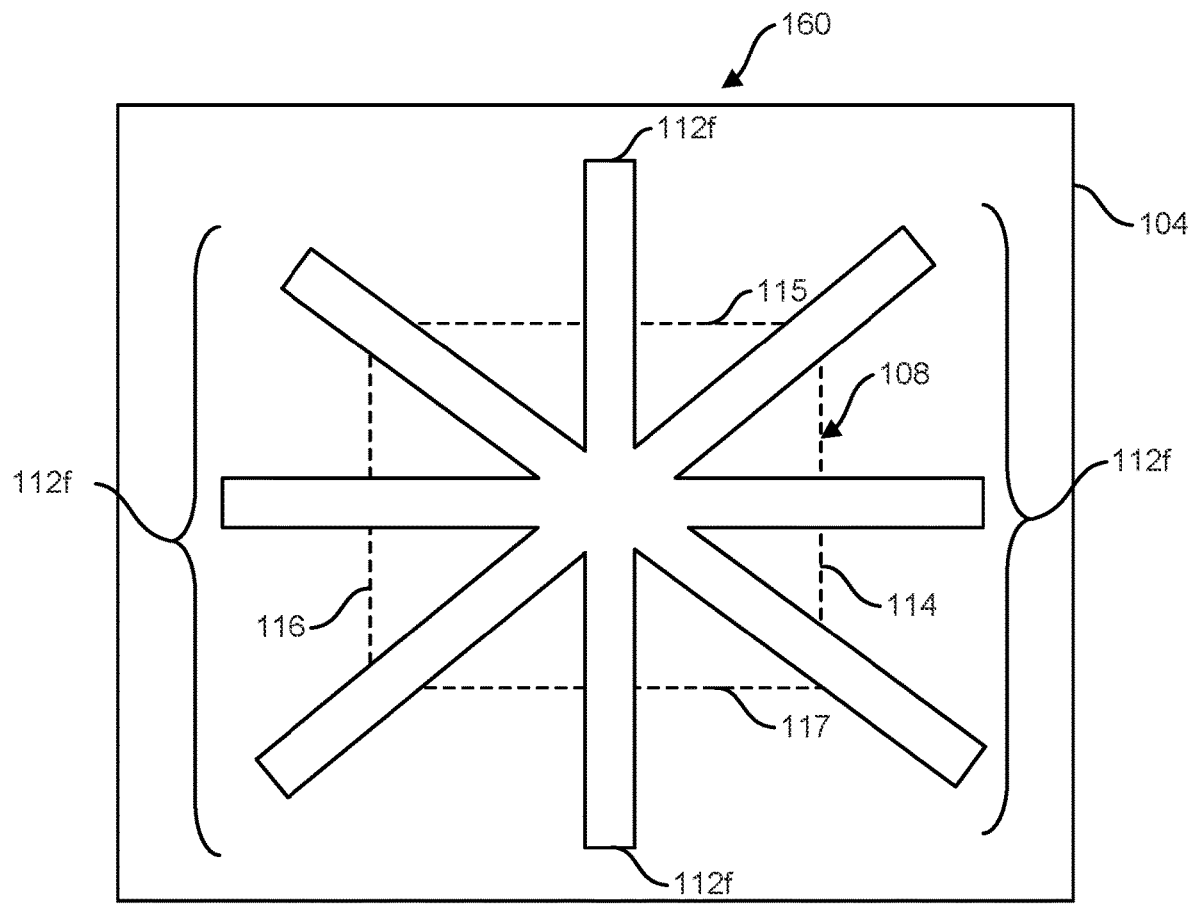

FIG. 1F is a top view illustrating an example configuration 160 of the second substrate 104 of FIG. 1A. Spacer 108 of FIG. 1A is indicated by dashed lines in FIG. 1F. In this example, a plurality of recesses 112f extend radially from the spacer 108, such that a recess 112f extends from proximate each of the four edges 114, 115, 116, and 117 of the spacer 108 and a recess 112f extends from proximate each corner of the spacer 108. In this example, recesses 112f extend between the spacer 108 and the second substrate 104 and intersect to form a star pattern between the spacer 108 and the second substrate 104. While eight recesses 112f extending radially from the spacer 108 are illustrated in FIG. 1F, in other examples, less than eight recesses or more than eight recesses may extend radially from the spacer 108. In addition, while recesses 112f are illustrated proximate four edges 114, 115, 116, and 117 and four corners of the spacer 108 in FIG. 1F, in other examples, recesses 112F may be arranged proximate only one edge, two edges, or three edges of the spacer 108 and/or proximate only one corner, two corners, or three corners of the spacer 108.

Figure 2:
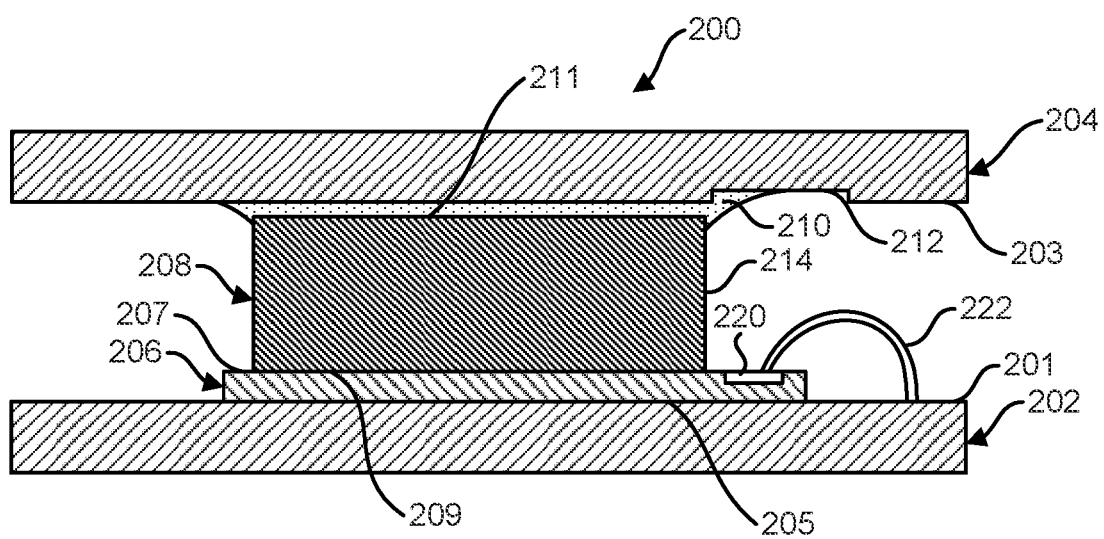
FIG. 2 is a cross-sectional view illustrating another example of a semiconductor package including recesses to contain solder.

FIG. 2 is a cross-sectional view illustrating another example of a semiconductor package 200. Semiconductor package 200 includes a first substrate 202, a second substrate 204, a semiconductor die 206, and a spacer 208. One surface 205 (e.g., the bottom surface) of the semiconductor die 206 is attached to a surface 201 (e.g., top surface) of the first substrate 202 (e.g., via an adhesive material or solder). One surface 209 (e.g., the bottom surface) of the spacer 208 is attached to another surface 207 (e.g., the top surface) of the semiconductor die 206. Another surface 211 (e.g., the top surface) of the spacer 208 is attached to one surface 203 (e.g., the bottom surface) of the second substrate 204 via solder 210. The surface 203 (e.g., bottom surface) of the second substrate 204 facing the spacer 208 includes a plurality of recesses 212 extending from proximate at least one edge 214 of the spacer 208 to contain a portion of the solder 210.

Semiconductor die 206 includes contact pads 220 facing the second substrate 204. Bond wires 222 electrically couple the contact pads 220 to the first substrate 202. The plurality of recesses 212 are arranged to extend over the contact pads 220 and the bond wires 222. Recesses 212 contain a portion (e.g., excess) of the solder 210 such that liquid solder does not drop onto contact pads 220 or bond wires 222 during soldering of the second substrate 204 to the spacer 208. Recesses 212 may be arranged in any suitable configuration, such as any of the example configurations 120, 130, 140, 150, or 160 previously described and illustrated with reference to FIGS. 1B-1F, respectively.

Figure 3A:
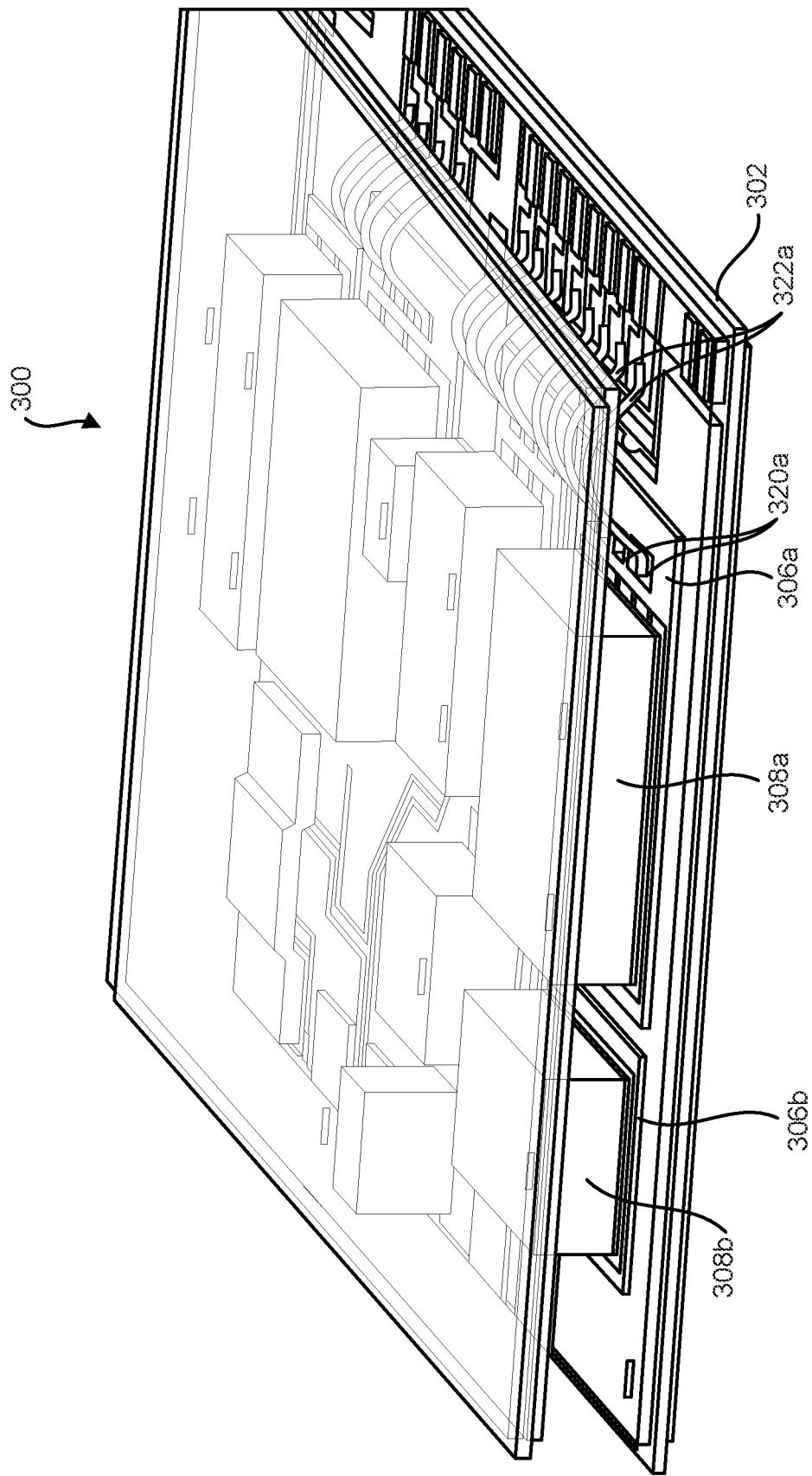
FIGS. 3A and 3B illustrate another example of a semiconductor package.
Figure 3B:
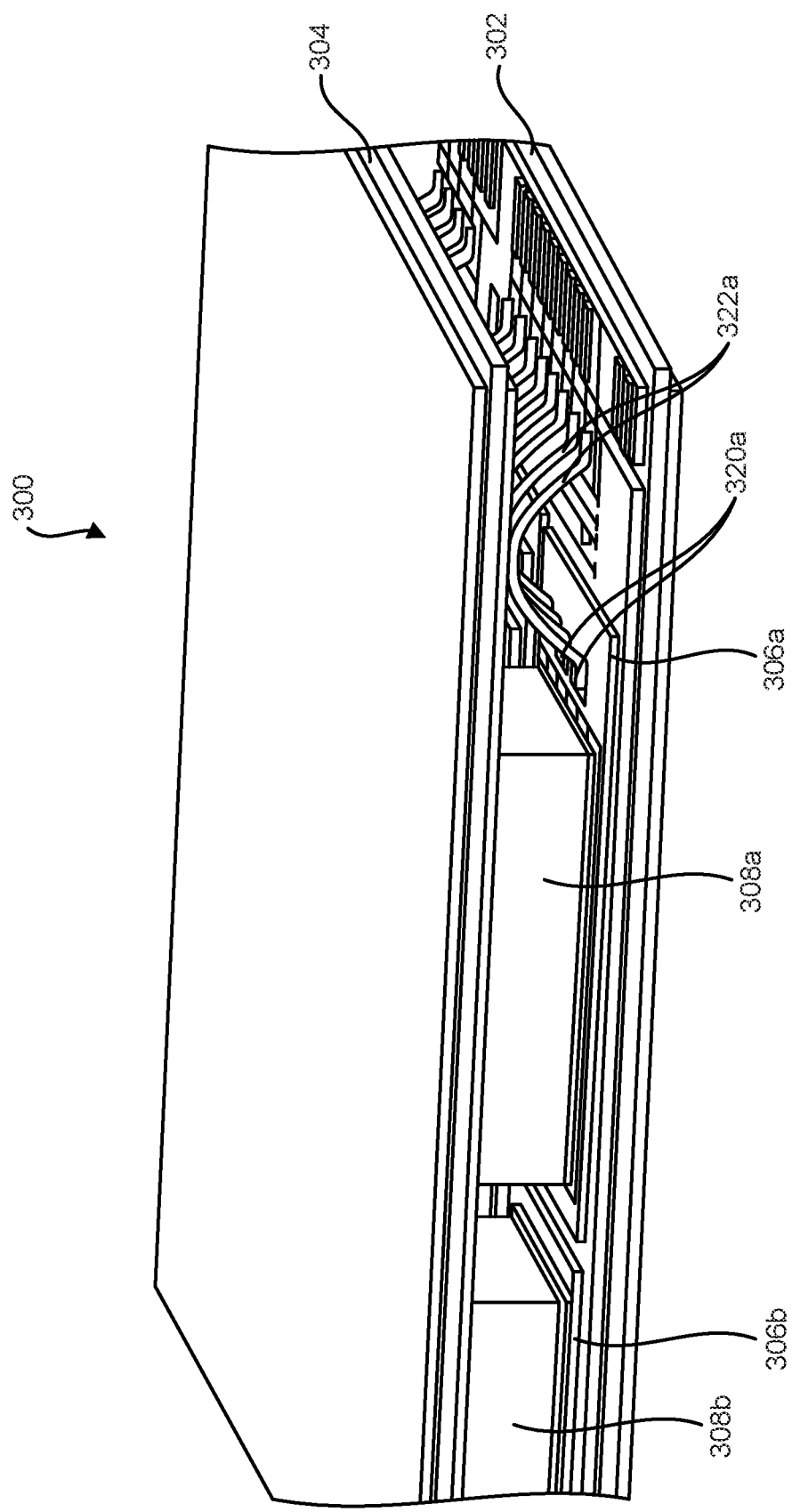

FIGS. 3A and 3B illustrate another example of a semiconductor package 300, such as a double sided cooling package. Semiconductor package 300 includes a first direct bonded copper (DBC) substrate 302, a second DBC substrate 304, a plurality of semiconductor dies (e.g., 306a and 306b) attached to the first DBC substrate 302, and a plurality of spacers (e.g., 308a and 308b) each attached to a respective semiconductor die and attached to the second DBC substrate via solder. The copper layer of the second DBC substrate 304 facing the spacers includes a plurality of recesses (e.g., as previously described and illustrated with reference to FIGS. 1A-1F) extending from proximate at least one edge of at least one spacer to contain a portion of the solder.

One or more semiconductor dies (e.g., 308a) may include contact pads (e.g., 320a) facing the second substrate 304. Bond wires (e.g., 322a) electrically couple the contact pads to the first substrate 302. The plurality of recesses may be arranged to extend over the contact pads and the bond wires. The recesses contain a portion (e.g., excess) of the solder such that liquid solder does not drop onto the contact pads or bond wires during soldering of the second substrate 304 to the spacers.

Figure 4A:
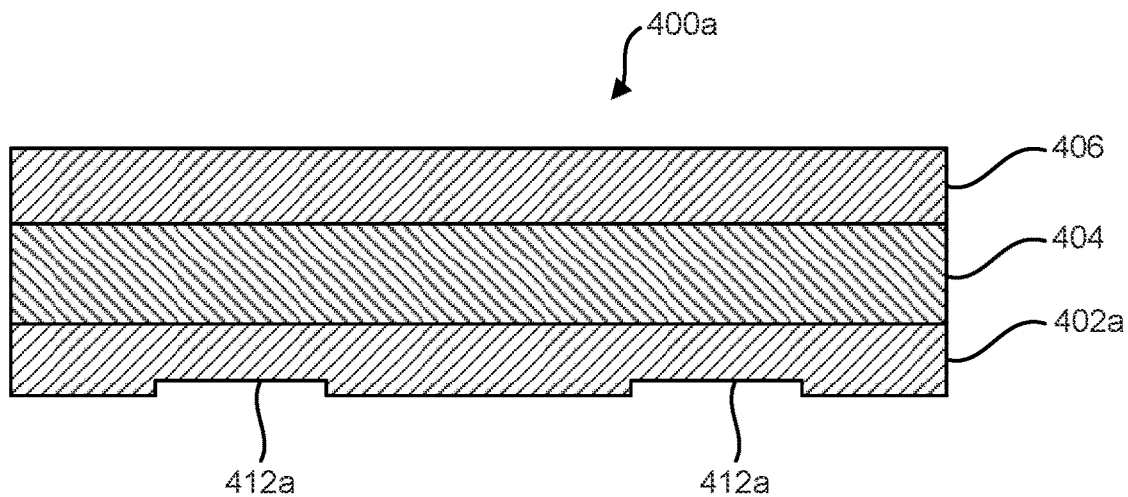
FIGS. 4A-4C are cross-sectional views illustrating example recesses of different depths in direct bonded copper (DBC) substrates for use in semiconductor packages.

FIG. 4A is a cross-sectional view illustrating one example of a substrate 400a, such as a DBC substrate for use in semiconductor packages (e.g., 100, 200, or 300). Substrate 400a includes a first metal layer 402a, a second metal layer 406, and a dielectric layer 404 between the first metal layer 402a and the second metal layer 406. The first metal layer 402a and the second metal layer 406 may include copper or another suitable metal. The dielectric layer 404 may include a ceramic material or another suitable dielectric material. A plurality of recesses 412a are formed in the first metal layer 402a. The plurality of recesses 412a may include any suitable configuration, such as a configuration previously described and illustrated with reference to FIGS. 1B-1F. Each recess 412a extends partially into the first metal layer 402a toward the dielectric layer 404. For example, each recess 412a may be micro-etched into the first metal layer 402a such that each recess has a depth less than one half the thickness of the first metal layer 402a.

Figure 4B:
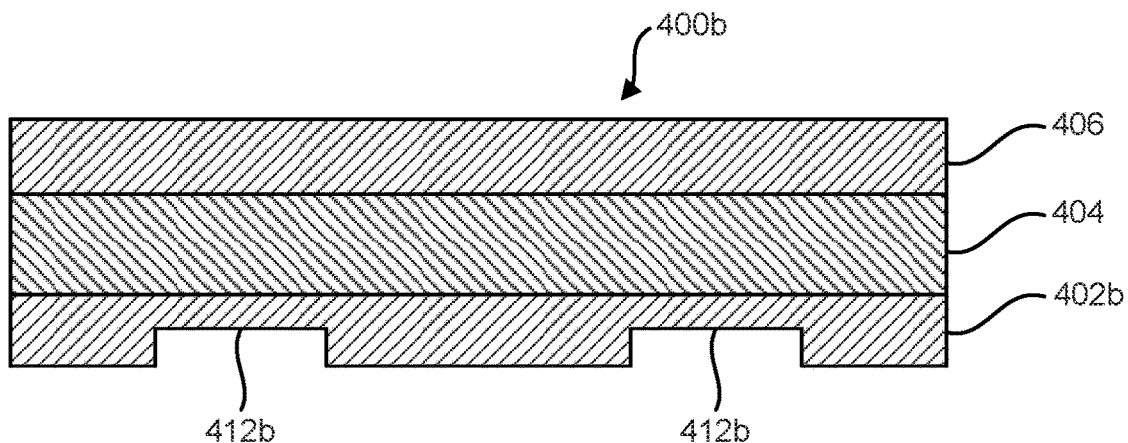

FIG. 4B is a cross-sectional view illustrating another example of a substrate 400b, such as a DBC substrate for use in semiconductor packages (e.g., 100, 200, or 300). Substrate 400b includes a first metal layer 402b, a second metal layer 406, and a dielectric layer 404 between the first metal layer 402b and the second metal layer 406. A plurality of recesses 412b are formed in the first metal layer 402b. The plurality of recesses 412b may include any suitable configuration, such as a configuration previously described and illustrated with reference to FIGS. 1B-1F. Each recess 412b extends partially into the first metal layer 402b toward the dielectric layer 404. For example, each recess 412b may extend into the first metal layer 402a to a depth greater than the depth of each recess 412a of FIG. 4A, such as one half the thickness of first metal layer 402b.

Figure 4C:
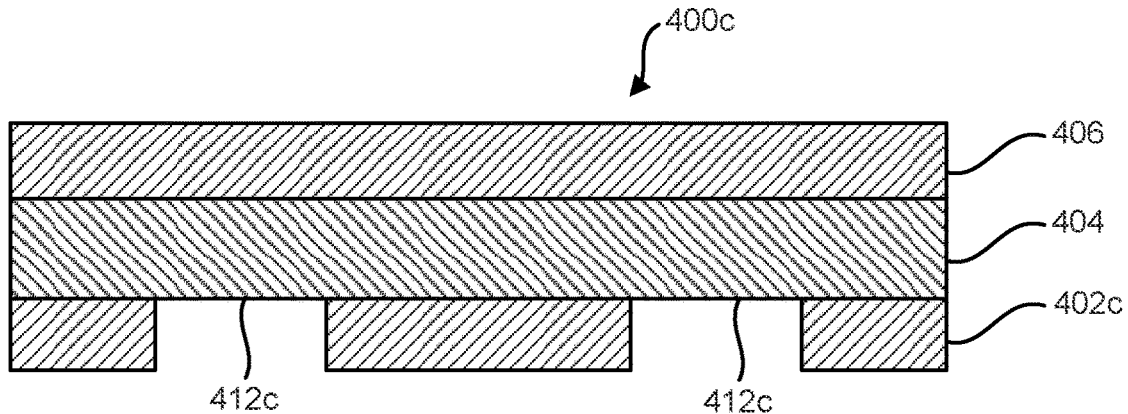

FIG. 4C is a cross-sectional view illustrating another example of a substrate 400c, such as a DBC substrate for use in semiconductor packages (e.g., 100, 200, or 300). Substrate 400c includes a first metal layer 402c, a second metal layer 406, and a dielectric layer 404 between the first metal layer 402c and the second metal layer 406. A plurality of recesses 412c are formed in the first metal layer 402c. The plurality of recesses 412c may include any suitable configuration, such as a configuration previously described and illustrated with reference to FIGS. 1B-1F. Each recess 412c extends completely through the first metal layer 402c to the dielectric layer 404.

Figure 5:
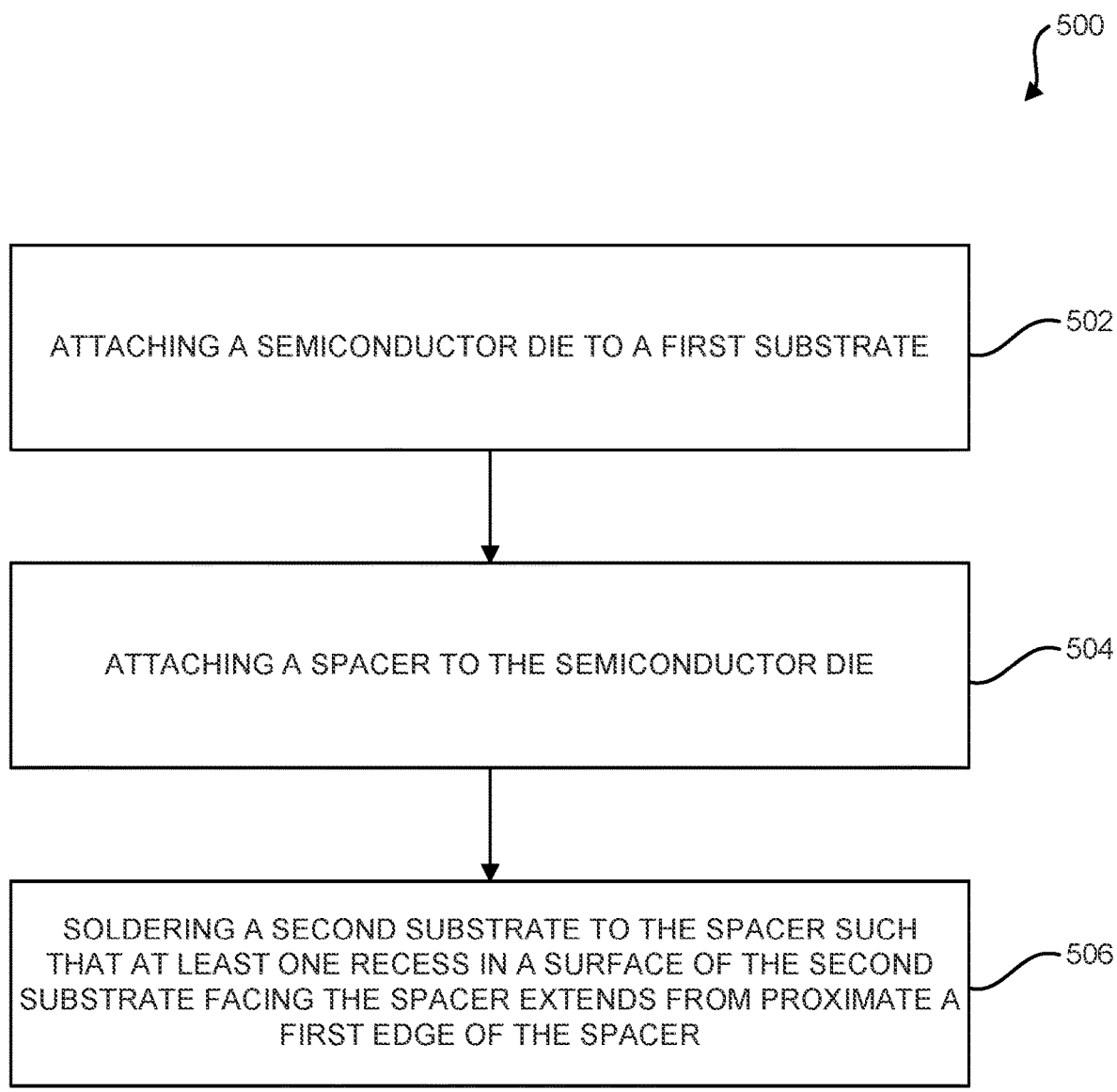
FIG. 5 is a flow diagram illustrating one example of a method for fabricating a semiconductor package.

FIG. 5 is a flow diagram illustrating one example of a method 500 for fabricating a semiconductor package, such as semiconductor package 100, 200, or 300 previously described and illustrated with reference to FIGS. 1A-3B. At 502, method 500 includes attaching a semiconductor die (e.g., 106, 206, or 306) to a first substrate (e.g., 102, 202, or 302). At 504, method 500 includes attaching a spacer (e.g., 108, 208, or 308) to the semiconductor die. At 506, method 500 includes soldering a second substrate (e.g., 104, 204, or 304) to the spacer such that at least one recess (e.g., 112 or 212) in a surface of the second substrate facing the spacer extends from proximate a first edge (e.g., 114 or 214) of the spacer. In one example, soldering the second substrate to the spacer may include soldering the second substrate to the spacer such that a plurality of recesses in the surface of the second substrate facing the spacer extend from proximate a plurality of edges of the spacer. During soldering, the solder may flow into the at least one recess. In one example, the second substrate is soldered to the spacer with the second substrate above the spacer (e.g., as shown by the orientations of the semiconductor packages 100, 200, and 300 of FIGS. 1A, 2, and 3B). In another example, the second substrate is soldered to the spacer with the spacer above the second substrate (e.g., with the semiconductor packages 100, 200, and 300 of FIGS. 1A, 2, and 3B flipped vertically).

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A semiconductor package comprising:
a first substrate;
a second substrate;
a semiconductor die attached to the first substrate; and
a spacer attached to the semiconductor die and attached to the second substrate via solder,
wherein a surface of the second substrate facing the spacer comprises a plurality of spaced apart recesses extending from proximate at least one edge of the spacer to contain a portion of the solder; and
wherein the plurality of recesses do not extend directly between the spacer and the second substrate.

2. The semiconductor package of claim 1, wherein at least one of the plurality of recesses extends perpendicular to the at least one edge of the spacer.

3. The semiconductor package of claim 1, wherein at least one of the plurality of recesses extends radially from the spacer.

4. The semiconductor package of claim 1, wherein the surface of the second substrate facing the spacer comprises a first plurality of recesses extending from proximate a first edge of the spacer and a second plurality of recesses extending from proximate a second edge of the spacer.

5. The semiconductor package of claim 1, wherein the second substrate comprises a first metal layer, a second metal layer, and a dielectric layer between the first metal layer and the second metal layer, the first metal layer facing the spacer, and the plurality of recesses formed in the first metal layer.

6. The semiconductor package of claim 5, wherein each recess of the plurality of recesses partially extends into the first metal layer toward the dielectric layer.

7. The semiconductor package of claim 5, wherein each recess of the plurality of recesses extends completely through the first metal layer to the dielectric layer.

8. The semiconductor package of claim 1, wherein each recess of the plurality of recesses comprises a depth, a width, and a length, wherein the length is greater than the depth and the width.

9. The semiconductor package of claim 1, wherein the semiconductor die comprises contacts pads facing the second substrate, and
wherein the plurality of recesses are arranged to extend over the contact pads.

10. The semiconductor package of claim 1, wherein a surface of the first substrate facing the semiconductor die comprises a plurality of recesses extending from proximate at least one edge of the semiconductor die.

11. A semiconductor package comprising:
a first direct bonded copper (DBC) substrate;
a second DBC substrate;
a semiconductor die attached to the first DBC substrate; and
a spacer attached to the semiconductor die and attached to the second DBC substrate via solder,
wherein a copper layer of the second DBC substrate facing the spacer comprises a plurality of recesses comprising at least one first recess extending from proximate a first edge of the spacer and at least one second recess extending from proximate a second edge of the spacer perpendicular to the first edge of the spacer to contain a portion of the solder; and
wherein the at least one first recess intersects the at least one second recess directly between the spacer and the second substrate.

12. The semiconductor package of claim 11, wherein the copper layer of the second DBC substrate facing the spacer comprises a plurality of recesses extending from proximate a plurality of edges of the spacer.

13. The semiconductor package of claim 11, wherein each recess of the plurality of recesses partially extends into the copper layer of the DBC substrate facing the spacer.

14. The semiconductor package of claim 11, wherein each recess of the plurality of recesses extends completely through the copper layer of the DBC substrate facing the spacer.

15. The semiconductor package of claim 11, wherein the semiconductor package comprises a double sided cooling package.

16. A method for fabricating a semiconductor package, the method comprising:
attaching a semiconductor die to a first substrate;
attaching a spacer to the semiconductor die; and
soldering a second substrate to the spacer such that a plurality of spaced apart recesses in a surface of the second substrate facing the spacer extend from proximate a first edge of the spacer and do not extend directly between the spacer and the second substrate.

17. The method of claim 16, wherein during soldering, solder flows into the plurality of recesses.

18. The method of claim 16, wherein the second substrate is soldered to the spacer with the second substrate above the spacer.

19. The method of claim 16, wherein the second substrate is soldered to the spacer with the spacer above the second substrate.

20. The method of claim 16, wherein soldering the second substrate to the spacer comprises soldering the second substrate to the spacer such that the plurality of recesses in the surface of the second substrate facing the spacer extend from proximate a plurality of edges of the spacer.

* * * * *